(12) United States Patent
Zhou et al.

(10) Patent No.: US 9,899,365 B1
(45) Date of Patent: Feb. 20, 2018

(54) LAYOUT OF SEMICONDUCTOR DEVICE

(71) Applicant: UNITED MICROELECTRONICS CORP., Hsin-Chu (TW)

(72) Inventors: Zhibiao Zhou, Singapore (SG); Ding-Lung Chen, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/409,498

(22) Filed: Jan. 18, 2017

(30) Foreign Application Priority Data

Dec. 7, 2016 (TW) .............................. 105140312 A

(51) Int. Cl.
| | | |
|---|---|---|
| H01L 23/528 | (2006.01) |
| H01L 27/02 | (2006.01) |
| H01L 27/092 | (2006.01) |
| H01L 29/06 | (2006.01) |
| H01L 23/535 | (2006.01) |

(52) U.S. Cl.
CPC ........ H01L 27/0207 (2013.01); H01L 23/535 (2013.01); H01L 27/092 (2013.01); H01L 29/0653 (2013.01)

(58) Field of Classification Search
CPC . H01L 23/528; H01L 23/5283; H01L 27/092; H01L 27/11807
USPC ......................................................... 257/903
See application file for complete search history.

(56) References Cited

U.S. PATENT DOCUMENTS

| | | | |
|---|---|---|---|
| 4,602,270 A | * | 7/1986 | Finegold ............... H01L 23/528 257/204 |
| 6,594,813 B1 | | 7/2003 | Gandhi et al. |
| 7,821,138 B2 | | 10/2010 | Yamada et al. |
| 2007/0141798 A1 | | 6/2007 | Bohr |
| 2011/0042752 A1 | | 2/2011 | Mayuzumi |
| 2011/0241126 A1 | | 10/2011 | Herberholz |
| 2014/0339641 A1 | | 11/2014 | Hong et al. |

* cited by examiner

*Primary Examiner* — Mark Prenty
(74) *Attorney, Agent, or Firm* — Winston Hsu

(57) ABSTRACT

A layout of a semiconductor device includes a first active area, a second active area, plural gates, a first conductive layout and plural plugs. The first and the second active areas are disposed on a substrate and surrounded by a shallow trench isolation (STI). The plural gates are parallel with one another and cross the first and the second active areas. The first conductive layer covers the plural gates, and the plural gates are electrically connected to each other through the first conductive layer. The plural plugs are disposed on the first conductive layer to electrically connect the plural gates.

15 Claims, 11 Drawing Sheets

LAYOUT OF SEMICONDUCTOR DEVICE

BACKGROUND OF THE INVENTION

1. Field of the Invention

The present invention relates generally to a layout of a semiconductor device and more particularly, to a layout of an inverter.

2. Description of the Prior Art

Semiconductor integrated circuits are one of the most important hardware bases in the modern information society. A key design point of the semiconductor industry is to increase integration of integrated circuits, and therefore to use the area of integrated circuits more efficiently.

Generally speaking, integrated circuits having complex functions are made up of many standard cells, each with basic functions. For example, standard cells of different kinds of logic gates, such as AND gates, OR gates, NOR gates, inverters, cells of flip-flops, adders and counters, are always used to realize complex integrated circuits.

It is found that valuable areas in the elements with cells of multi-heights are always wasted and complexities of circuit design and manufacturing processes are both increased. Therefore, an integrated circuit layout structure that is able to comply with requirements of superior space utilization efficiency is still needed.

SUMMARY OF THE INVENTION

In order to solve the above-mentioned issues, the present invention provides a layout of a semiconductor device, in which a conductive layer is disposed in an inverter structure to electrically connect two different metal-oxide semiconductor (MOS) transistors, so that, the interconnection thereof may be built before the formation of plugs structures. Thus, the cell size of the semiconductor device in the present invention may be sufficiently shrunk by about 20%.

To achieve the purpose described above, the present invention provides a layout of a semiconductor device including first and second active areas, a plurality of gates, a first conductive layer and a plurality of plugs. The first and the second active areas are disposed on a substrate and surrounded by a shallow trench isolation. The gates are parallel with one another on the substrate, to cross the first and the second active areas. The first conductive layer covers the gates, and the gates are electrically connected to each other through the first conductive layer. The plugs are disposed on the first conductive layer and electrically connected to the gates.

The present invention provides a novel layout of the semiconductor device, such as an inverter device, in which a conductive layer in a pre-plug level is used to form at least a portion of the interconnection system thereof, such that, the number of the plugs formed subsequently may be reduced dramatically and the arrangement of the plugs may therefore be more flexible. That is, the entire layout of the semiconductor device, such as the inverter device, is sufficient to be shrunk by about 20% to more than 20%. Furthermore, according to the present invention, plugs are optionally to be formed partially overlapping with the diffusion regions (for example the source regions). For example, only a portion of the plugs may directly contact the diffusion regions, and the remaining portion of the plugs is disposed on an adjacent STI region. Thus, through disposing such plug structure or the conductive layer, the plug structure is no longer needed to be formed in alignment with the diffusion regions or the gates, thereto simplifying the cell size and the entire layout efficiently.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 9-11 are schematic diagrams illustrating a layout of a semiconductor device according to a fifth preferred embodiment of the present invention, wherein FIG. 10 shows a schematic cross-sectional view taken along a cross line B1-B1' and B2-B2' in FIG. 9.

DETAILED DESCRIPTION

To provide a better understanding of the present invention, preferred embodiments will be described in detail. The preferred embodiments of the present invention are illustrated in the accompanying drawings with numbered elements.

Figure 1:
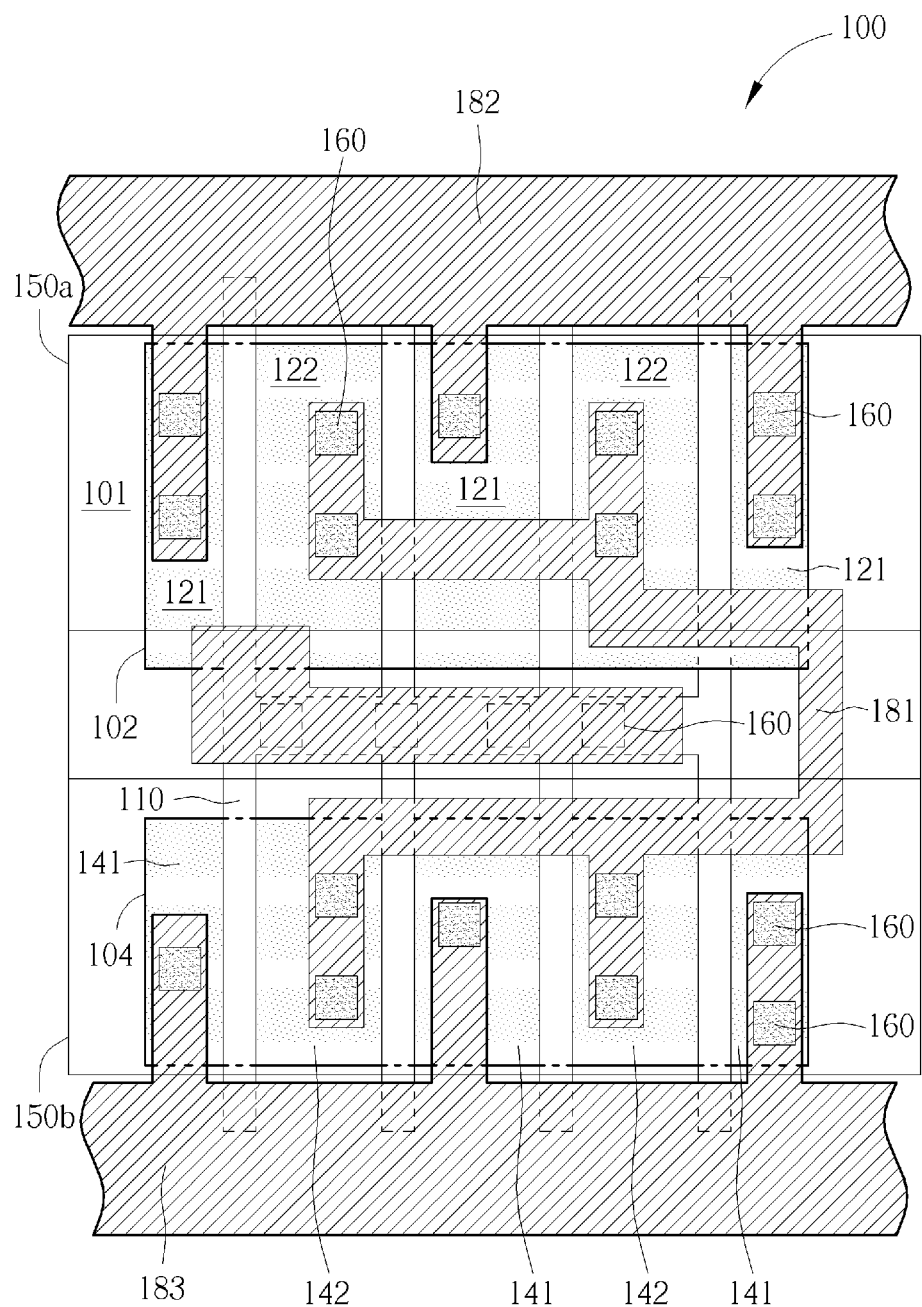
FIG. 1 is a schematic diagram illustrating a layout of a semiconductor device according to a first preferred embodiment of the present invention.

Referring to FIG. 1, FIG. 1 shows a layout of a semiconductor device according to the first preferred embodiment of the present invention. At first, a semiconductor substrate (not shown in the drawings) is provided, and an active area (AA) 102, an AA 104 and a shallow trench isolation (STI) region 101 surrounded the AAs 102, 104 are formed thereon. In one embodiment, the semiconductor substrate for example includes a silicon substrate, silicon containing substrate (such as SiC or SiGe) or a silicon on insulator (SOI) substrate, but is not limited thereto.

At least one gate 110 is disposed on the semiconductor substrate and is extended along a first direction such as a y-direction, to simultaneously cross the AAs 102, 104, as shown in FIG. 1. In one embodiment, the gate 110 includes a gate dielectric layer (not shown in the drawings) and a gate electrode layer (not shown in the drawings) disposed on the semiconductor substrate, and a spacer (not shown in the drawings) surrounded the gate dielectric layer and the gate electrode layer. In the present embodiment, a plurality of the gates 110, for example four gates 110 as shown in FIG. 1, is disposed on the semiconductor substrate, and the four gates 110 are in contact with each other and cross the AAs 102, 104 to therefore define two different transistor regions 150*a*, 150*b*.

The transistor regions 150*a* consists of the four gates 110 and source regions 121 and drain regions 122 disposed at two sides of the gates 110 in the AA 102, and the transistor region 150*b* consists of the four gates 110 and the source regions 141 and drain regions 142 disposed at two sides of the gates 110 in the AA 104. The two transistor regions 150a, 150b may include the same conductive type or different conductive types. In the present embodiment, the transistor region 150a preferably includes a P-type MOS transistor region, and the transistor region 150b preferably includes an N-type MOS transistor region. That is, the drain regions 122, 142 of the transistor regions 150a, 150b may be electrically connected to each other through plugs 160 disposed on the drain regions 122, 142, and further in contact with a metal line 181, and the source regions 121, 141 of the transistor regions 150a, 150b may also be electrically connected to each other through the plugs 160 disposed on the source regions 121, 141 and further in contact with metal lines 182, 183. Accordingly, the transistor regions 150a, 150b are able to electrically connect to a high-voltage supply (VDD) and a low-voltage supply (VSS) respectively, as shown in FIG. 1, and then, the present embodiment may therefore perform like an inverter 100, with the transistor regions 150a, 150b functioning as a pull-up transistor region and a pull-down transistor respectively.

Thus, the layout of the inverter 100 in the first preferred embodiment of the present invention is obtained. According to the present embodiment, the interconnection system of the inverter 100 consists of the plugs 160 and the metal lines 181, 182, 183 formed on the AAs 102, 104.

The people skilled in the art should easy realize the layout of the semiconductor device is not limited to what is shown in the first preferred embodiment, and may include different embodiments. The following description will detail the different embodiments of a layout of semiconductor device in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 2:
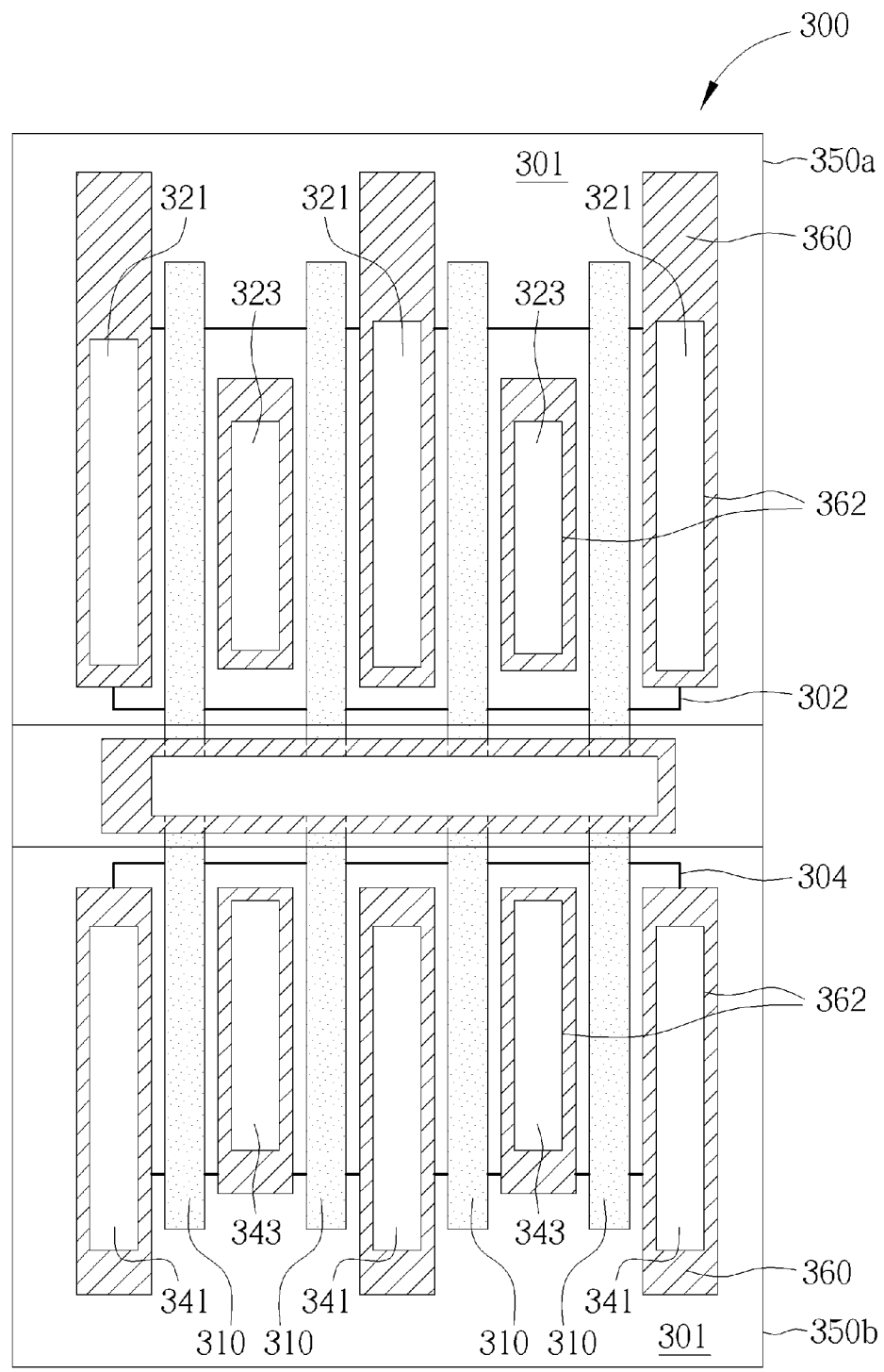
FIGS. 2-3 are schematic diagrams illustrating a layout of a semiconductor device according to a second preferred embodiment of the present invention.
Figure 3:
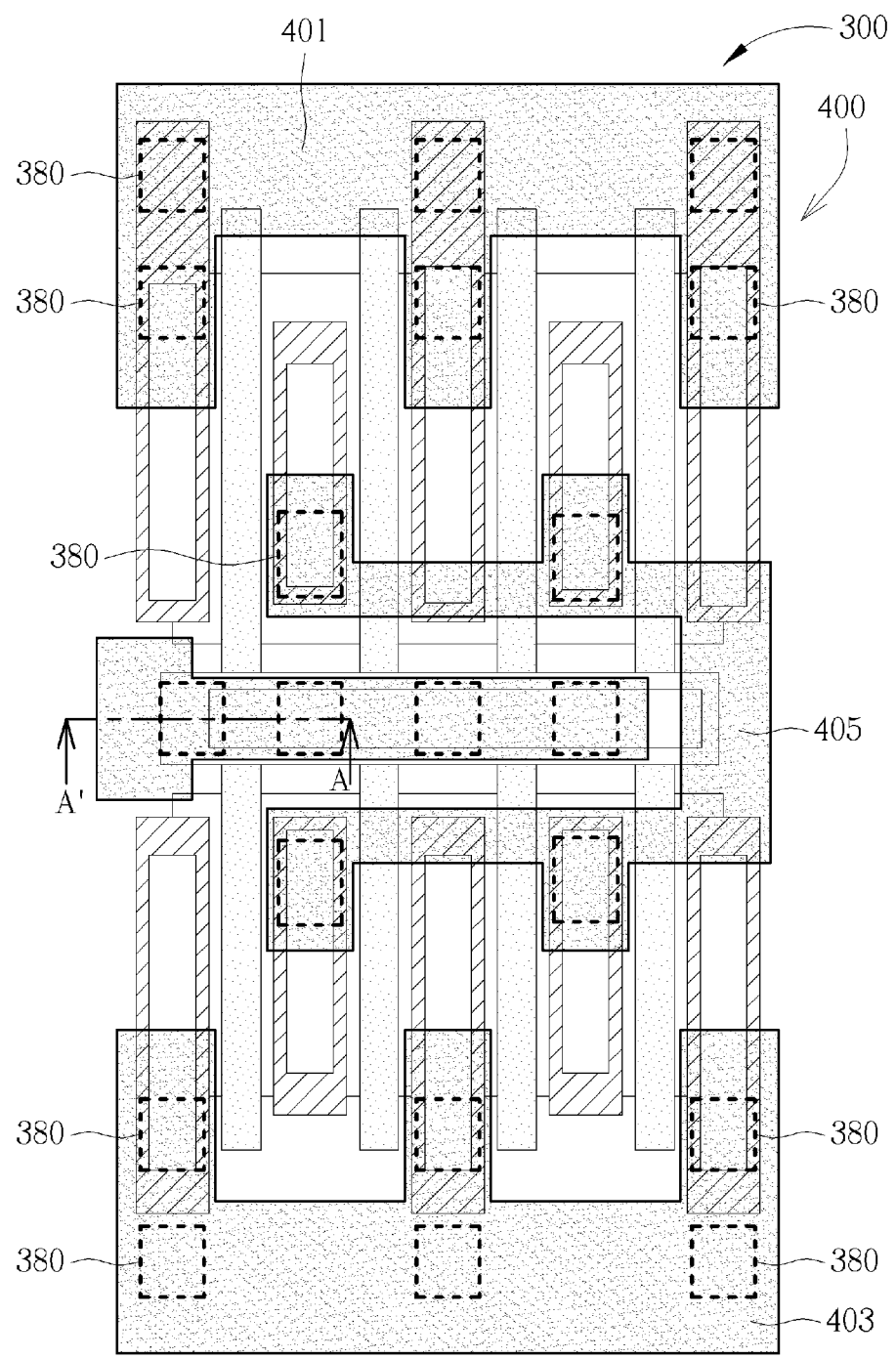
Figure 4:
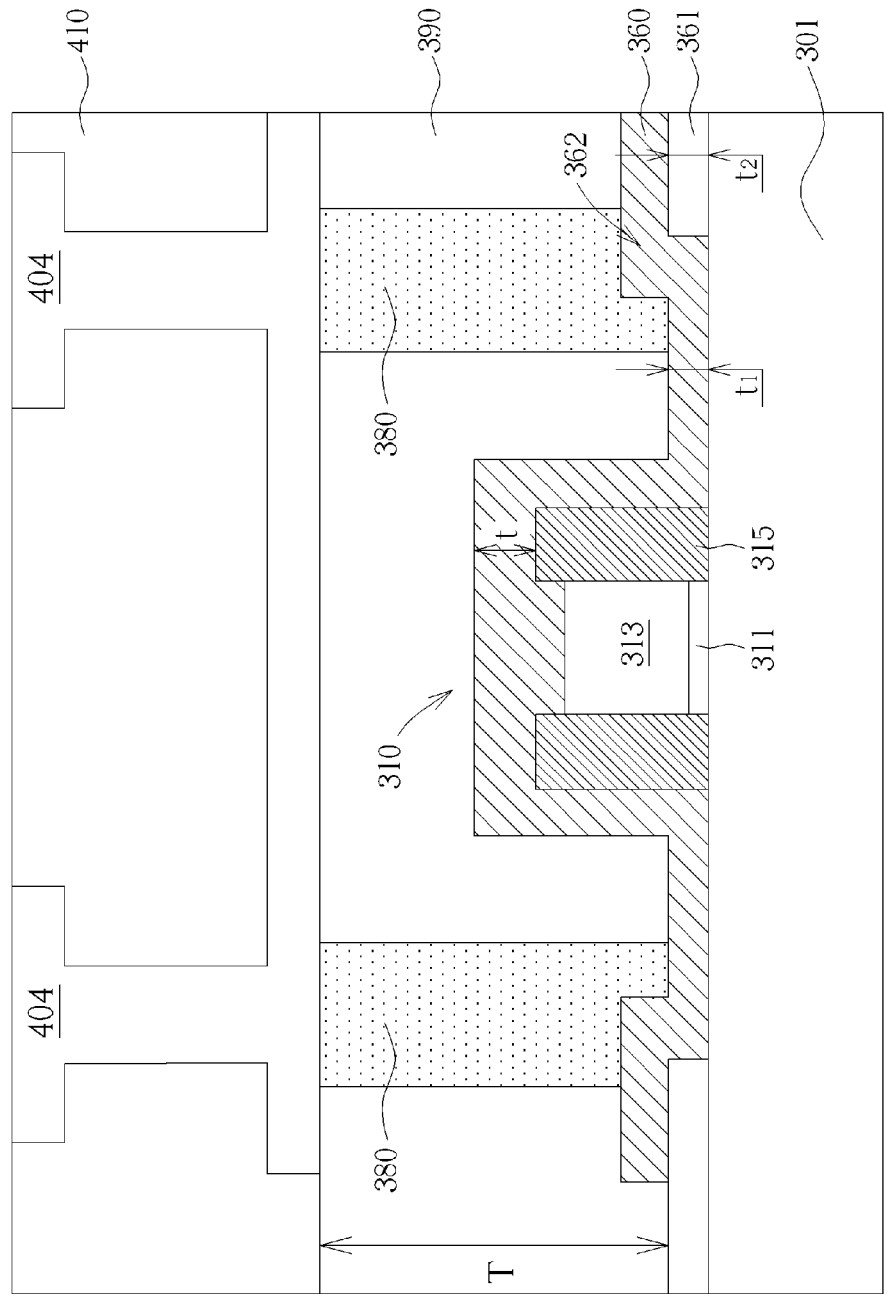
FIG. 4 is a schematic cross-sectional view taken along a cross line A-A' in FIG. 3.

Referring to FIGS. 2-4, a layout of a semiconductor device according to the second preferred embodiment of the present invention is shown, wherein FIG. 4 shows a schematic cross-sectional view taken along the cross line A-A in the FIG. 3. In the present embodiment, a layout of an inverter 300 is provided, and the inverter 300 also includes a semiconductor substrate (not shown in the drawings), AAs 302, 304 defined thereon and a STI region 301 surrounded the AAs 302, 304, as shown in FIG. 2. The aforementioned features are all similar to those in the first preferred embodiment and will not be further detailed hereafter.

A difference between the present embodiment and the aforementioned first preferred embodiment is in that, a plurality of gates, such as four gates 310 separated from one another as shown in FIG. 4, is formed. In one embodiment, each gate 310 includes a gate dielectric layer 311 and a gate electrode layer 313 disposed on the semiconductor substrate, and a spacer layer 315 surrounded the gate dielectric layer 311 and a gate electrode layer 313. The gates 310 are disposed on the semiconductor substrate and extended along the first direction (such as the y-direction) to cross the AAs 302, 304. That is, two different transistor regions 350a, 350b are defined.

The transistor regions 350a consist of the four gates 310, and source regions 321 and drain regions 323 disposed at two sides of the gates 310 in the AA 102, and the transistor regions 350b consist of the four gates 310, and the source regions 341 and drain regions 343 disposed at two sides of the gates 310 in the AA 304. The two transistor regions 350a, 350b may include a P-type MOS transistor region and an N-type MOS transistor region respectively, so that, the two transistor regions 350a, 350b may together form the inverter 300 shown in FIG. 2, with the two transistor regions 350a, 350b functioning like a pull-up transistor region and a pull-down transistor respectively.

Another difference between the present embodiment and the aforementioned first preferred embodiment is in that, an insulating layer 361 and a metal conductive layer 360 are sequentially formed on the semiconductor substrate, after the formation of the gates 310 and the source and drain regions, as shown in FIG. 4. Precisely speaking, the insulating layer 361, for example including $SiO_x$, SiN or SiON, is firstly formed on the gates 310 and AAs 302, 304 to directly contact the gates 310 and the AAs underneath, and a plurality of openings 362 is then formed in the insulating layer 361, either above the gates 310 or above the source regions 321, 341 and the drain regions 323, 343, to at least partially expose top surfaces of the gates 310 and/or the source regions 321, 341 and the drain regions 323, 343. Following these, a conductive material layer (not shown in the drawings) is formed on the insulating layer 361 and filled in the openings 362, and a lithography process is performed to pattern the conductive material layer, thereto form the metal conductive layer 360. The metal conductive layer 360 may include titanium (Ti), titanium nitride (TiN) or tungsten (W), and a thickness t1 of the metal conductive layer 360 is less than a thickness of the gates 310. It is noted that, the metal conductive layer 360 contacts and electrically connects the exposed gates 310, the exposed source regions 321, 341 and/or the exposed drain regions 323, 343 via the portion filled in the openings 362, so that, the conductive areas of the gates 310, the source regions 321, 341 and/or the drain regions 323, 343 are allowable to be extended to the adjacent STI 301 via the meta 1 conductive layer 360, as shown in FIG. 2. That is, the four gates 310 are electrically connected with each other directly through the metal conductive layer 360 disposed above the gates 310 instead of the plugs formed in subsequent process.

Then, an insulating layer 390 with a planarization surface is formed on the semiconductor substrate, to cover the metal conductive layer 360 and the gates 310, and a plurality of plugs 380 is formed in the insulating layer 390 to electrically connect the gates 310, the source regions 321, 341 and the drain regions 323, 343, respectively. In the present embodiment, the insulating layer 390 has a thickness T, which is about 7-10 times greater than the thickness t1 of the metal conductive layer 360 or the thickness t2 of the insulating layer 361, but is not limited thereto. The plugs 380 are formed in the insulating layer 390, with bottom surfaces thereof directly contacting the metal conductive layer 360, and with top surfaces thereof being leveled with the insulating layer 390, as shown in FIG. 4. That is, the plugs 380 may electrically connect to the gates 310, the source regions 321, 341 and/or the drain regions 323, 343 respectively through the metal conductive layer 360. On the other hand, through disposing the metal conductive layer 360, the conductive area of the gates 310, the source regions 321, 341 or the drain regions 323, 343 have been extended to the adjacent STI region 301. Thus, the plugs 380 are allowed to be formed over the STI region 301 as shown in FIGS. 3-4, without either being in alignment with the gates 310, the source regions 321, 341 or the drain regions 323, 343, or directly contacting the gates 310. Also, the plugs 380 contacting the gates 310 may be formed over the STI region 301 at two sides of the gates 310, and the formations thereof will no longer be affected by the gates 310 underneath.

After that, an insulating layer 410 and metal lines 400 are formed on the insulating layer 390. As shown in FIG. 4, the metal lines 400 are formed in the insulating layer 410, and which are electrically connected to the gates 310, the source regions 321, 341 and/or the drain regions 323, 343 through the plugs 380 and the metal conductive layer 360. Precisely, the metal lines 400 include a high-voltage supply (Vdd) 401, a low-voltage supply (Vss) 403 such as ground, and the metal lines 400, the plugs 380 and the metal conductive layer 360 together form an interconnection system of the semiconductor device in the present embodiment. That is, a source regions 321 of the transistor region 350a are electrically connected to the high-voltage supply 401, and the source regions 341 of the transistor region 350b are electrically connected to the low-voltage supply 403, thereto form the inverter 300. On the other hand, the drain regions 323, 343 of the transistors 350a, 350b are electrically connected with each other via the metal lines 405, as shown in FIG. 3.

In this way, the layout of the inverter 300 in the second preferred embodiment of the present invention is obtained. According to the present embodiment, the interconnection system of the inverter 300 consists of the metal conductive layer 360 in a pre-plug level, and the plugs 380, and the metal lines 400 in a post-plug level, so that, the four gates 310 thereof may be electrically connected with each other directly through the metal conductive layer 360 disposed over the gates 310. Furthermore, with the arrangement of the metal conductive layer 360, the conductive area of the gates 310, the source regions 321, 341 or the drain regions 323, 343 are allowable to be further extended to the adjacent STI region 301, and the plugs 380 formed in a subsequent process are no longer needed to be formed in alignment of the gates 310, the source regions 321, 341 and/or the drain regions 323, 343. That is, the plugs with different length are therefore avoided in the present invention, and the arrangement of the plugs 380 may be much more flexible accordingly. For example, the plugs 380 may be formed at least partially overlapping the STI region 301 to keep from affecting the gates 310 underneath. On the other hand, the plugs 380 connected to the source regions 321, 341 and the metal lines 400 may also be formed directly over the STI region 301, and utilize the metal conductive layer 360 underneath to achieve the electrically connection therebetween. Then, the entire layout of the inverter 300 in the present embodiment is shrunk by about 20%, in comparison with the layout of the inverter 100 of the first preferred embodiment.

Figure 5:
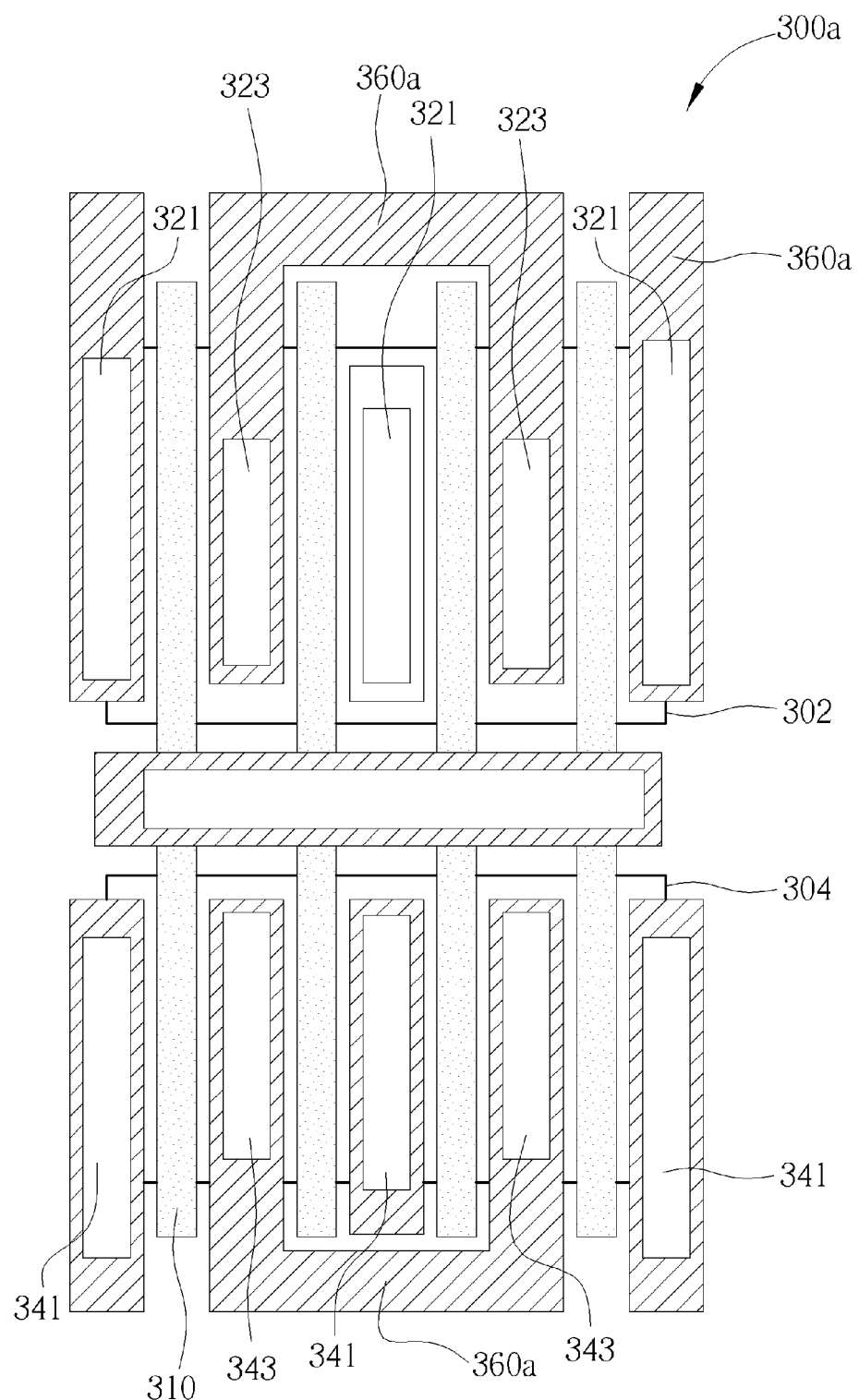
FIGS. 5-6 are schematic diagrams illustrating a layout of a semiconductor device according to a third preferred embodiment of the present invention.
Figure 6:
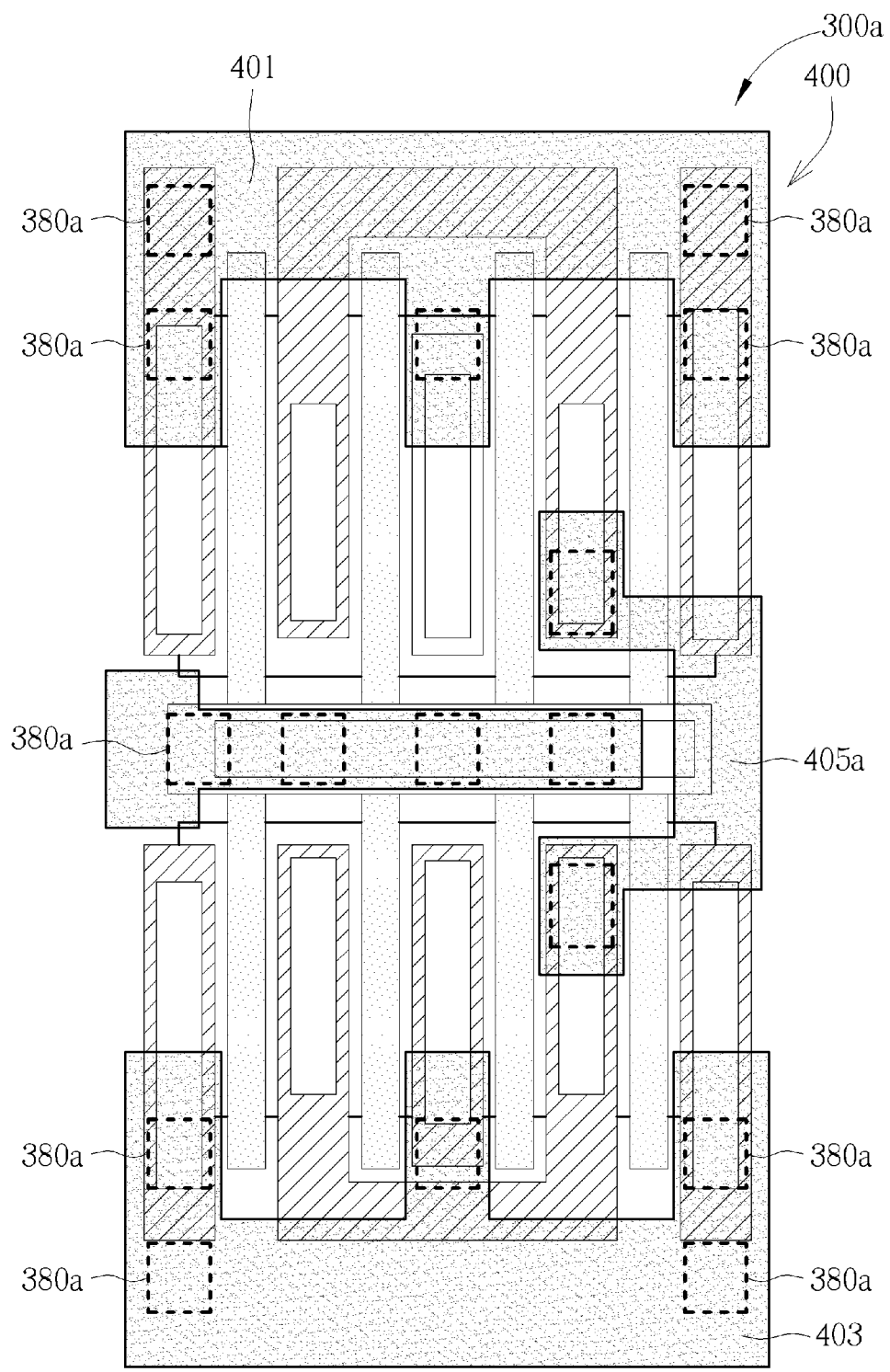

Referring to FIGS. 5-6, a layout of a semiconductor device according to the third preferred embodiment of the present invention is shown. In the present embodiment, a layout of an inverter 300a is provided, and the inverter 300a also includes a semiconductor substrate (not shown in the drawings), AAs 302, 304 defined thereon, a STI region 301 surrounded the AAs 302, 304, and gates 310, as shown in FIG. 5. The aforementioned features are all similar to those in the second preferred embodiment and will not be further detailed hereafter.

A difference between the present embodiment and the aforementioned second preferred embodiment is in that, two drain regions 323 of the transistor region 350a are electrically connected with each other through a metal conductive layer 360a before the formation of plugs 380a. Likewise, two drain regions 343 of the transistor region 350b are electrically connected with each other also through the metal conductive layer 360a before the formation of plugs 380a. Then, the insulating layer 390, the plugs 380a, the insulating layer 410 and the metal lines 400 are formed. As shown in FIG. 6, the source regions 321 of the present embodiment are electrically connected to the high-voltage supply 401, the source regions 341 of the transistor region 350b are electrically connected to the low-voltage supply 403, and the transistor regions 350a, 350b may together form the inverter 300a. It is noted that, since the two drain regions 323 of the transistor region 350a and the two drain regions 343 of the transistor region 350b are connected with each other via the metal conductive layer 360 in the pre-plug level, and only a few number of the plugs 380a are requested to be formed on the drain regions 323, 343 in the present embodiment for connecting the drain regions 323, 343 to the metal lines 405a.

In this way, the layout of the inverter 300a in the third preferred embodiment of the present invention is obtained. According to the present embodiment, the interconnection between the drain regions 323, 343 of the two transistors 350a, 350b is previously built through the metal conductive layer 360a, so that, the number of the plugs 380a formed subsequently may therefore be reduced dramatically. That is, the entire layout of the inverter 300a of the present embodiment may further be shrunk by about 23% shrinkage, but not limited thereto.

Figure 7:
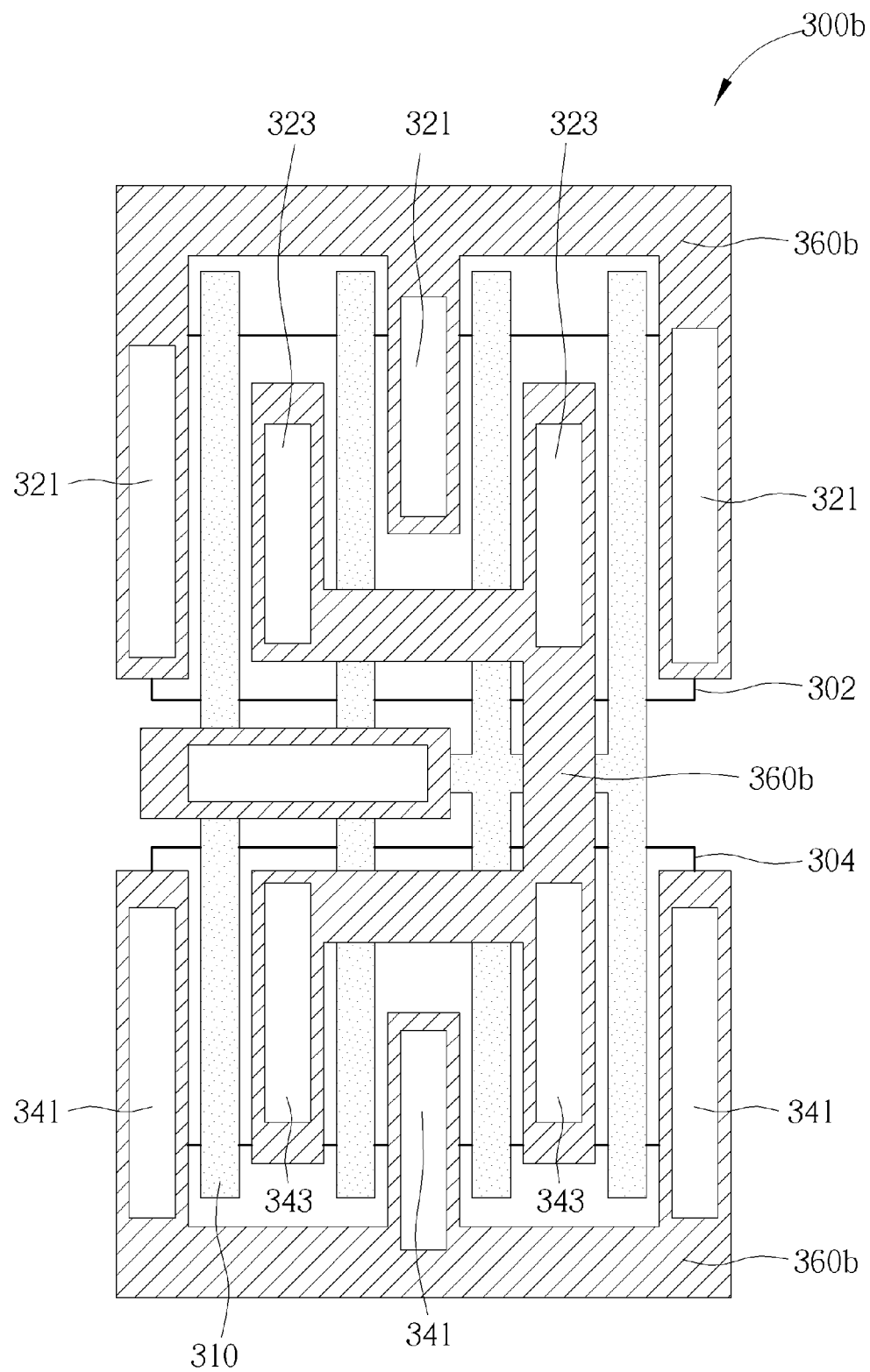
FIGS. 7-8 are schematic diagrams illustrating a layout of a semiconductor device according to a fourth preferred embodiment of the present invention.
Figure 8:
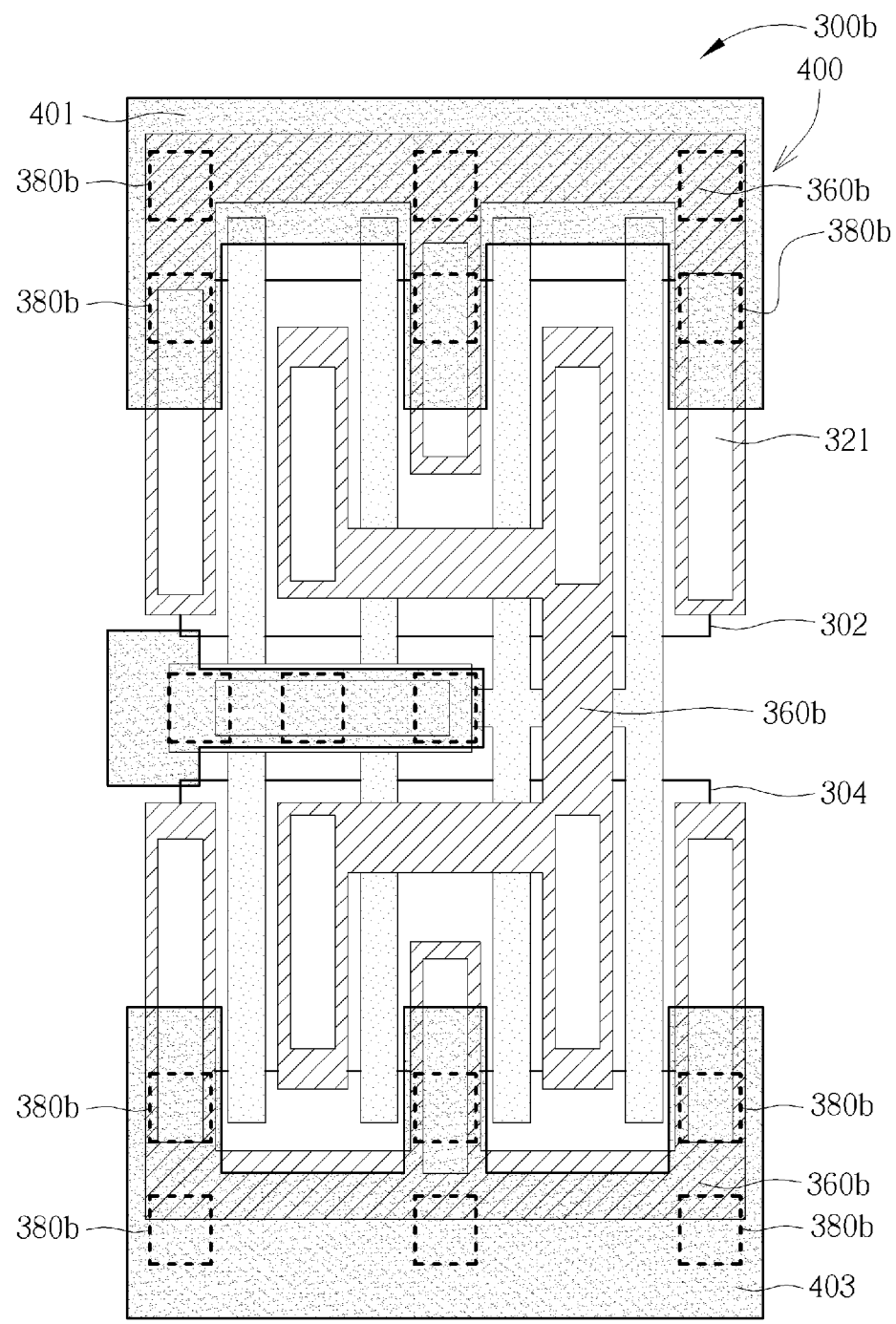

Referring to FIGS. 7-8, a layout of a semiconductor device according to the fourth preferred embodiment of the present invention is shown. In the present embodiment, a layout of an inverter 300b is provided, and the inverter 300b also includes a semiconductor substrate (not shown in the drawings), AAs 302, 304 defined thereon, a STI region 301 surrounded the AAs 302, 304, and gates 310, as shown in FIG. 7. The aforementioned features are all similar to those in the second preferred embodiment and will not be further detailed hereafter.

A difference between the present embodiment and the aforementioned second preferred embodiment is in that, three source regions 321 of the transistor region 350a are electrically connected with each other through a metal conductive layer 360b before the formation of plugs 380b. Likewise, three source regions 341 of the transistor region 350b are electrically connected with each other also through the metal conductive layer 360b before the formation of plugs 380b. Additionally, the two drain regions 323 of the transistor region 350a and the two drain regions 343 of the transistor region 350b are not only electrically connected with each other, but also further connected to the drain regions 323, 343 through the metal connective layer 360b, as shown in FIG. 7. The metal connective layer 360b connected to the drain regions 323, 343 is formed to cross a portion of the gates 310 optionally, as shown in FIG. 7, but is not limited thereto.

Then, the insulating layer 390, the plugs 380b, the insulating layer 410 and the metal lines 400 are formed. As shown in FIG. 8, the source regions 321 of the present embodiment are electrically connected to the high-voltage supply 401, the source regions 341 of the transistor region 350b are electrically connected to the low-voltage supply 403, and the inverter 300b is therefore formed by the transistor regions 350a, 350b. It is noted that, since the source regions 321, 341 of the two transistor region 350a, 350b are connected with each other via the metal conductive layer 360 in the pre-plug level, additional plugs or metal lines for electrically connecting thereto may be omitted accordingly. In this way, the layout of the inverter 300b in the fourth preferred embodiment may further be shrunk, in comparison with that of the aforementioned embodiments.

Figure 9:
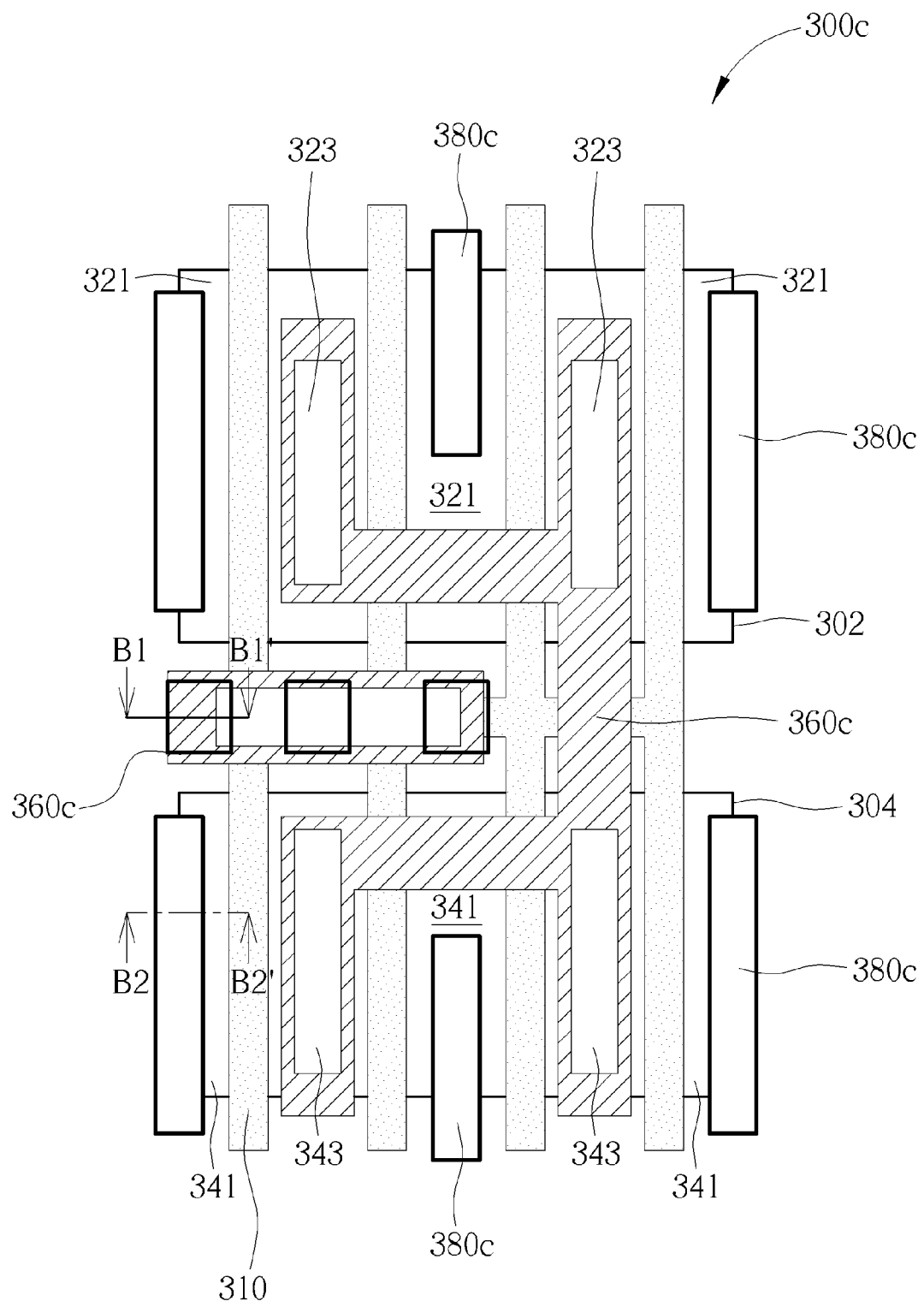
Figure 10:
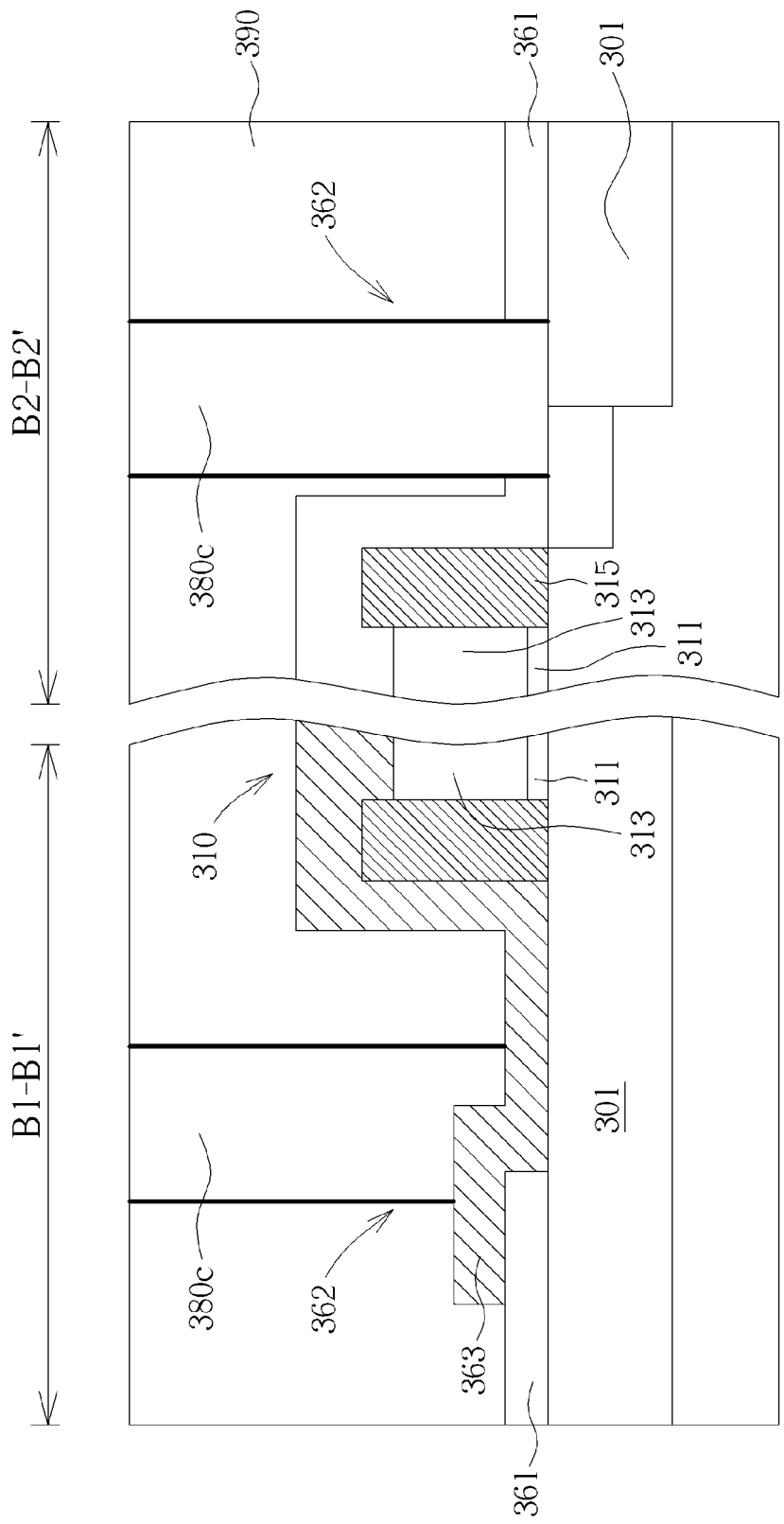
Figure 11:
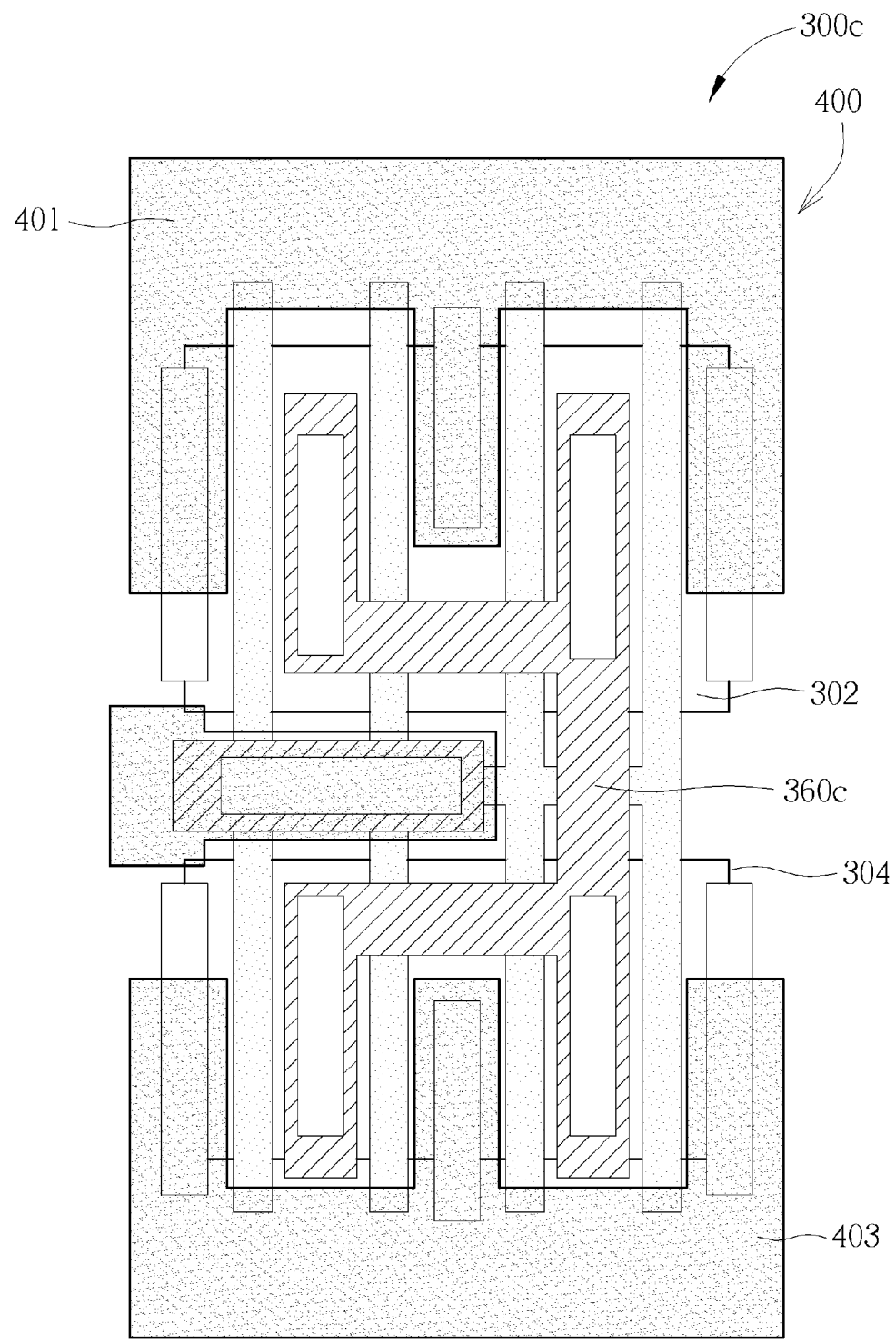

Referring to FIGS. 9-11, a layout of a semiconductor device according to the fifth preferred embodiment of the present invention is shown, in which FIG. 10 shows the cross sectional view taken along the cross lines B1-B1' and B2-B2' in FIG. 9. In the present embodiment, a layout of an inverter 300c is provided, and the inverter 300c also includes a semiconductor substrate (not shown in the drawings), AAs 302, 304 defined thereon, a STI region 301 surrounded the AAs 302, 304, and gates 310, as shown in FIG. 9. The aforementioned features are all similar to those in the second preferred embodiment and will not be further detailed hereafter.

A difference between the present embodiment and the aforementioned second preferred embodiment is in that, the gates 310 are electrically connected with each other through a metal conductive layer 360c, and the two drain regions 323 of the transistor regions 350a and the two drain regions 343 of the transistor regions 350b are also electrically connected with each other only through the metal conductive layer 360c, as shown in FIG. 9. Then, a plurality of plugs 380c is formed. The plugs 380c are formed in the insulating layer 390, to electrically connect the gates 310 and the source regions 321, 341 of the two transistor regions 350a, 350b respectively. It is noted that, the plug 380c for connecting the gate only contacts the metal conductive layer 360c and utilizes the metal conductive layer 360c to achieve the electrically connection to the gates 310. On the other hand, the plugs 380c for connecting the source regions 321, 341 penetrates the insulating layer 361 covering the semiconductor substrate to directly contact the source regions 321, 341 to achieve the electrically connection thereto, as shown in FIGS. 9-10. Also, in the present embodiment, the plugs 380c connected to the source regions 321, 341 preferably include a slot shape extending along the first direction (such as the y-direction) and partially overlapping the source regions 321, 341 and the STI region 301. In other words, the plugs 380c connected to the source regions 321, 341 are not in alignment with the source regions 321, 341, and the plugs 380 are able to achieve the electrically connection to the source regions 321, 341 only thorough partially contacting the source regions 321, 341.

Then, the insulating layer 410 and the metal lines 400 are formed. As shown in FIG. 11, the source regions 321, 341 are electrically connected to the high-voltage supply 401 and the low-voltage supply 403 respectively via the plugs 380c, and the inverter 300c in the fifth preferred embodiment is therefore formed by the transistor regions 350a, 350b. According to the present embodiment, the conductive layer 360c in the pre-plugs level and the plugs 380c are used respectively, to electrically connect the drain regions 323, 343 and the source regions 321, 341 of the transistor regions 350a, 350b. Instead of being in alignment with the source regions 321, 341, the plugs 380c connected to the source regions 321, 341 in the present embodiment are formed to only partially overlap the source regions 321, 341, and the remaining portion of the plugs 380c are actually formed on the STI region 301. Thus, the arrangement of the plugs 380c may be more flexible and the number of the plugs 380c may be sufficiently reduced accordingly. In this way, the entire layout of the inverter 300c of the present embodiment may be further shrunk in comparison with that of the aforementioned embodiments.

Overall, the present invention provides a novel layout of the semiconductor device, such as an inverter device, in which a conductive layer in a pre-plug level is used to format least a portion of the interconnection system thereof, such that, the number of the plugs formed subsequently may be reduced dramatically and the arrangement of the plugs may therefore be flexible. That is, the entire layout of the semiconductor device, such as the inverter device, is sufficient to be shrunk by about 20% to more than 20%. Furthermore, according to the present invention, plugs are optionally to be formed partially overlapping with the diffusion regions (for example the source regions). For example, only a portion of the plugs directly contacts the diffusion regions, and the remaining portion of the plugs is disposed on an adjacent STI region. Thus, through disposing such plug structure or the conductive layer, the plug structure is no longer needed to be formed in alignment with the diffusion regions or the gates, thereby simplifying the cell size and the entire layout efficiently. Although the embodiments exemplified by the present inventions are in the layouts of the inverter, the metal conductive layer and the plug structure may further be used on other semiconductor devices, such as a flip-flop device, thereto build the interconnection system in a pre-plug level and to achieve a reduced cell size.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout of a semiconductor device, comprising:
 a first active area and a second active area disposed on a substrate and surrounded by a shallow trench isolation (STI);
 a plurality of gates parallel with one another and disposed on the substrate, the gates across the first active area and the second active area;
 a first conductive layer, covering and contacting the gates, wherein the gates are electrically connected to each other through the first conductive layer; and
 a plurality of plugs disposed on the first conductive layer and electrically connected to the gates.

2. The layout of the semiconductor device according to claim 1, wherein the first conductive layer is disposed on the STI.

3. The layout of the semiconductor device according to claim 1, wherein the first conductive layer has a thickness being less than a thickness of the gates.

4. The layout of the semiconductor device according to claim 1, further comprising:
 a first insulating layer disposed between the gates and the first conductive layer; and
 a second insulating layer disposed on the first conductive layer, and the plugs being disposed in the second insulating layer.

5. The layout of the semiconductor device according to claim 1, wherein the first active area comprises a first source region, a first drain region, a second source region and a second drain region disposed at two sides of the gates respectively.

6. The layout of the semiconductor device according to claim 5, wherein the first drain region and the second drain region are electrically connected to each other through a second conductive layer.

7. The layout of the semiconductor device according to claim 6, wherein the second conductive layer crosses a portion of the gates.

8. The layout of the semiconductor device according to claim 6, wherein the second active area comprises a third source region, a third drain region, a fourth source region and a fourth drain region disposed at two sides of the gates respectively, and the third drain region and the fourth drain region are electrically connected to the first drain region and the second drain region through the second conductive layer.

9. The layout of the semiconductor device according to claim 5, wherein the first source region and the second source region are electrically connected to each other through a third conductive layer.

10. The layout of the semiconductor device according to claim 5, wherein the first conductive layer covers the first source region, the first drain region, the second source region and the second drain region respectively, and the first source region and the second source are electrically connected to each other through the plugs and a metal layer disposed on the plugs.

11. The layout of the semiconductor device according to claim 1, wherein at least two of the gates are connected with each other.

12. The layout of the semiconductor device according to claim 1, wherein at least one of the plugs is partially disposed over the STI.

13. The layout of the semiconductor device according to claim 5, wherein at least one of the plugs is partially disposed over the STI and the first source region.

14. The layout of the semiconductor device according to claim 13, wherein the plugs comprises a slot-shape.

15. The layout of the semiconductor device according to claim 5, wherein the gates, the first active area, the first source region, the first drain region, the second source region and the second drain region together forma PMOS transistor or an NMOS transistor.

* * * * *